(12) United States Patent
Yokota

(10) Patent No.: US 10,527,160 B2
(45) Date of Patent: Jan. 7, 2020

(54) RESIN CASE FOR CONTROL UNIT FOR TRANSMISSION

(71) Applicant: HONDA MOTOR CO., LTD., Tokyo (JP)

(72) Inventor: Hirotaka Yokota, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 15/942,633

(22) Filed: Apr. 2, 2018

(65) Prior Publication Data

US 2018/0283534 A1    Oct. 4, 2018

(30) Foreign Application Priority Data

Mar. 31, 2017    (JP) ................................. 2017-071004

(51) Int. Cl.
| | |
|---|---|
| H05K 5/00 | (2006.01) |
| F16H 61/00 | (2006.01) |
| H05K 5/02 | (2006.01) |
| H05K 7/20 | (2006.01) |

(52) U.S. Cl.
CPC ....... F16H 61/0006 (2013.01); H05K 5/0017 (2013.01); H05K 5/0082 (2013.01); H05K 5/0217 (2013.01); H05K 7/20409 (2013.01)

(58) Field of Classification Search
CPC .................................................. F16H 61/0006
USPC ............... 439/34, 76.1, 485, 76.2; 74/606 R; 361/736, 752
See application file for complete search history.

(56) References Cited

U.S. PATENT DOCUMENTS

| | | | | | |
|---|---|---|---|---|---|
| 3,786,208 | A | * | 1/1974 | Edwards | H01R 24/66 200/51 R |
| 4,560,839 | A | * | 12/1985 | Dillard | H04Q 1/028 379/19 |
| 4,873,422 | A | * | 10/1989 | Streich | F24H 3/0417 392/363 |
| 5,137,455 | A | * | 8/1992 | Moerbe | B60R 11/00 137/884 |
| 5,310,351 | A | * | 5/1994 | McAdow | H01H 50/12 439/485 |

(Continued)

FOREIGN PATENT DOCUMENTS

| | | |
|---|---|---|
| JP | H09-076784 A | 3/1997 |
| JP | 2002-301994 A | 10/2002 |

(Continued)

OTHER PUBLICATIONS

Office Action dated Feb. 5, 2019, issued in counterpart JP application No. 2017-071004, with English translation. (6 pages).

(Continued)

*Primary Examiner* — Neil Abrams
(74) *Attorney, Agent, or Firm* — Westerman, Hattori, Daniels & Adrian, LLP

(57) ABSTRACT

A resin case is placed directly on an external wall of a vehicle transmission, and configures an outer peripheral side of a control unit for the transmission, with a connector to be joined to a harness connected to a functional component inside the transmission being electrically connected to the control unit. The resin case includes a case body and a rib provided to an outer surface of the case body. For example, the rib configures a heat release rib.

5 Claims, 7 Drawing Sheets

(56) References Cited

U.S. PATENT DOCUMENTS

| | | | | |
|---|---|---|---|---|
| 5,361,650 A * | 11/1994 | Klecker | ............. | F16H 61/0006 |
| | | | | 174/521 |
| 5,502,615 A * | 3/1996 | Kubota | ................ | B60K 37/02 |
| | | | | 361/647 |
| 5,709,134 A * | 1/1998 | Ulm | ................... | B60R 16/0239 |
| | | | | 74/606 R |
| 5,749,060 A * | 5/1998 | Graf | ..................... | B60W 30/18 |
| | | | | 340/439 |
| 5,814,911 A * | 9/1998 | Daniels | ............. | H02K 11/0094 |
| | | | | 310/68 A |
| 5,823,070 A * | 10/1998 | Taniguchi | .......... | F16H 61/0006 |
| | | | | 74/606 R |
| 5,941,716 A * | 8/1999 | Yoshigi | ............... | H01R 9/2483 |
| | | | | 439/76.2 |
| 6,173,622 B1 * | 1/2001 | Carnevale | ............. | B60K 20/00 |
| | | | | 180/336 |
| 6,657,852 B2 * | 12/2003 | Reker | ................. | H05K 7/1465 |
| | | | | 174/64 |
| 6,679,137 B1 * | 1/2004 | Bek | .................... | F16H 61/0009 |
| | | | | 74/606 R |
| 6,707,243 B2 * | 3/2004 | Ito | ........................ | H01J 29/073 |
| | | | | 313/404 |
| 6,863,566 B2 * | 3/2005 | Scheuerer | ............ | H01R 35/025 |
| | | | | 439/191 |
| 7,044,751 B2 * | 5/2006 | Takanashi | ............. | B60T 8/3675 |
| | | | | 439/247 |
| 7,050,305 B2 * | 5/2006 | Thorum | ............... | H05K 5/0013 |
| | | | | 165/185 |
| 7,073,410 B2 * | 7/2006 | Albert | ................ | F16H 61/0009 |
| | | | | 257/E23.098 |
| 7,594,452 B2 * | 9/2009 | Morise | ................ | F16H 61/0006 |
| | | | | 74/606 R |
| 7,832,306 B2 * | 11/2010 | Suzuki | ............... | B60R 16/0207 |
| | | | | 318/551 |
| 8,038,465 B2 * | 10/2011 | Pavlovic | .............. | H01R 13/514 |
| | | | | 361/719 |
| 8,189,336 B2 * | 5/2012 | Garcia | ............... | H05K 7/20854 |
| | | | | 165/104.33 |
| 8,248,800 B2 * | 8/2012 | Takata | ................ | F16H 61/0006 |
| | | | | 165/104.33 |
| 8,286,532 B2 * | 10/2012 | Konig | ................ | F16H 61/0006 |
| | | | | 74/606 R |
| 9,520,659 B2 * | 12/2016 | Loibl | .................... | H01R 12/58 |
| 10,090,727 B2 * | 10/2018 | Bradfield | ................. | H02K 5/10 |
| 2006/0248972 A1 * | 11/2006 | Kawaguchi | ......... | F16H 61/0006 |
| | | | | 74/335 |
| 2018/0283533 A1 * | 10/2018 | Omoto | ................ | F16H 61/0006 |
| 2018/0283534 A1 * | 10/2018 | Yokota | ............... | F16H 61/0006 |

FOREIGN PATENT DOCUMENTS

| | | |
|---|---|---|
| JP | 2003-272754 A | 9/2003 |
| JP | 2005-178474 A | 7/2005 |

OTHER PUBLICATIONS

English translation of Search Report dated Mar. 25, 2019, issued in counterpart CN Application No. 201810234733.X (1 page).
Office Action dated Mar. 28, 2019, issued in counterpart CN Application No. 201810234733.X, with English translation (9 pages).
Office Action dated Sep. 30, 2019, issued in counterpart CN Application No. 201810234733.A, with English translation (8 pages).

* cited by examiner

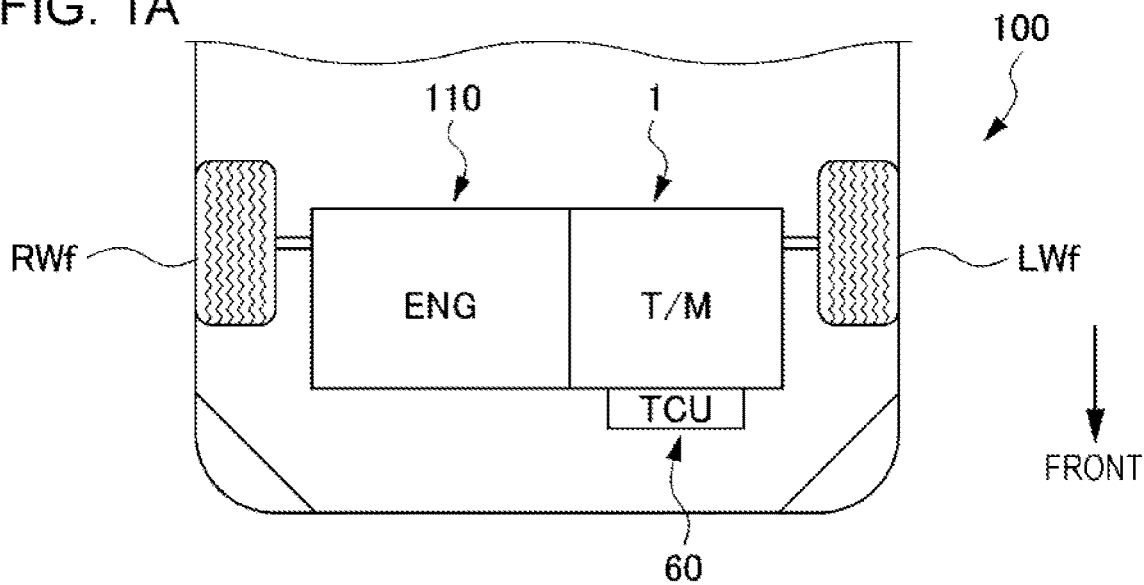
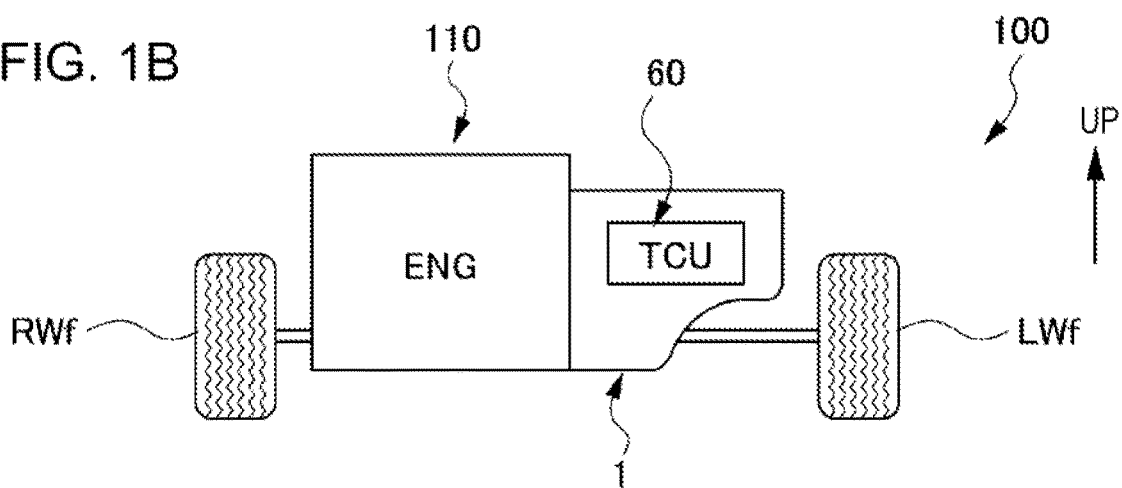
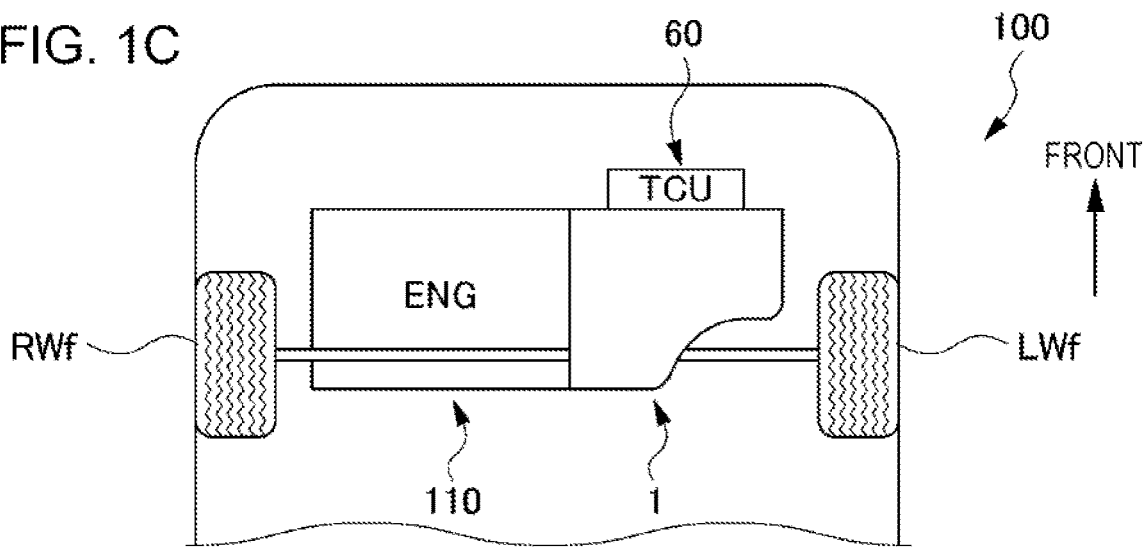

RESIN CASE FOR CONTROL UNIT FOR TRANSMISSION

CROSS REFERENCE TO RELATED APPLICATION

The present application claims priority under 35 U.S.C. § 119 to Japanese Patent Application No. 2017-071004, filed Mar. 31, 2017, entitled "Resin Case." The contents of this application are incorporated herein by reference in their entirety.

BACKGROUND

1. Field

The present disclosure relates to a resin case configuring an outer peripheral side of a vehicle transmission control unit.

2. Description of the Related Art

Hitherto, vehicles such as automobiles have been provided with transmission control units to control a transmission installed to the vehicle. The control unit is, for example, mounted to an upper face of the transmission (see, for example, Japanese Unexamined Patent Application Publication No. 2002-301994).

In the control unit described in Japanese Unexamined Patent Application Publication No. 2002-301994, a terminal of the control unit is subject to wear as a result of vibration when high gravitational acceleration (G) acts on the transmission and the control unit.

SUMMARY

The present disclosure describes a resin case capable of suppressing wear of a control unit terminal as a result of vibration of the control unit.

(1) A resin case that is placed directly on an external wall of a vehicle transmission, and that configures an outer peripheral side of a control unit for the transmission, with a harness connected to a functional component inside the transmission being electrically connected to the control unit. The resin case includes a case body and a rib provided to an outer surface of the case body.

In the resin case of (1), rigidity of the resin case is secured by the rib on the outer surface of the case body of the resin case of the control unit, enabling rubbing wear of a terminal of the control unit as a result of vibration of the resin case to be suppressed. Moreover, vibration of an electronic substrate housed inside the control unit is suppressed, enabling damage to electronic components disposed on the electronic substrate to be suppressed.

(2) In the resin case of (1), configuration may be made wherein the rib configures a heat release rib.

In the resin case of (2), due to providing the heat release rib, the surface area of the resin case of the control unit is increased, thereby enabling more heat from the control unit to be dissipated. This thereby enables heat generated by the electronic substrate inside the control unit to be efficiently dissipated to the outside of the control unit.

(3) In the resin case of either (1) or (2), configuration may be made wherein a first connector to which the harness is electrically connected is provided to the case body, and the rib includes a peripheral rib that at least partially surrounds a periphery of the first connector at the outer surface of the case body facing at least an external wall of the transmission.

In the resin case of (3), direct water penetration into the first connector can be suppressed during pressure washing with high-pressure water. This thereby enables the waterproofing of the first connector to be improved.

(4) In the resin case of (3), configuration may be made wherein the peripheral rib surrounds a lower side of the periphery of the first connector.

In the resin case of (4), water penetration into the first connector by high-pressure water spraying up from below can be suppressed during pressure washing with high-pressure water. This thereby enables the waterproofing of the first connector with respect to high-pressure water from below to be improved.

(5) In the resin case of either (3) or (4), configuration may be made wherein a second connector that is electrically connected to a central controller for drive control of the vehicle is provided to the case body. Moreover, the peripheral rib is disposed such that the outer surface where the case body faces the external wall of the transmission is partitioned into a region including the first connector and a region including the second connector.

In the resin case of (5), water penetration into the first connector with high-pressure water from the direction of the region including the second connector can be suppressed during pressure washing with high-pressure water. This thereby enables the waterproofing of the first connector with respect to high-pressure water from the direction of the region including the second connector to be improved.

(6) In the resin case of (5), configuration may be made wherein the rib includes a connection rib that connects the peripheral rib and the second connector together.

In the resin case of (6), although force acts on the first connector and the second connector from different directions, due to providing the connection rib, the rigidity with respect to force from these different directions is raised, enabling elastic deformation of the resin case to be suppressed. As a result, the effect of elastic deformation of the resin case on a terminal of the control unit can be reduced, enabling wear of the terminal of the control unit to be suppressed.

The present disclosure is capable of providing a resin case capable of suppressing wear of a control unit terminal as a result of vibration of the control unit.

BRIEF DESCRIPTION OF THE DRAWINGS

FIG. 1A is a plan view schematically illustrating a vehicle to which a TCU provided with a resin case according to a first embodiment of the present disclosure is attached.

FIG. 1B is a front view schematically illustrating a vehicle to which a TCU provided with a resin case according to the first embodiment of the present disclosure is attached.

FIG. 1C is a view from underneath schematically illustrating a vehicle to which a TCU provided with a resin case according to the first embodiment of the present disclosure is attached.

DESCRIPTION OF THE PREFERRED EMBODIMENTS

First Embodiment

Figure 2:
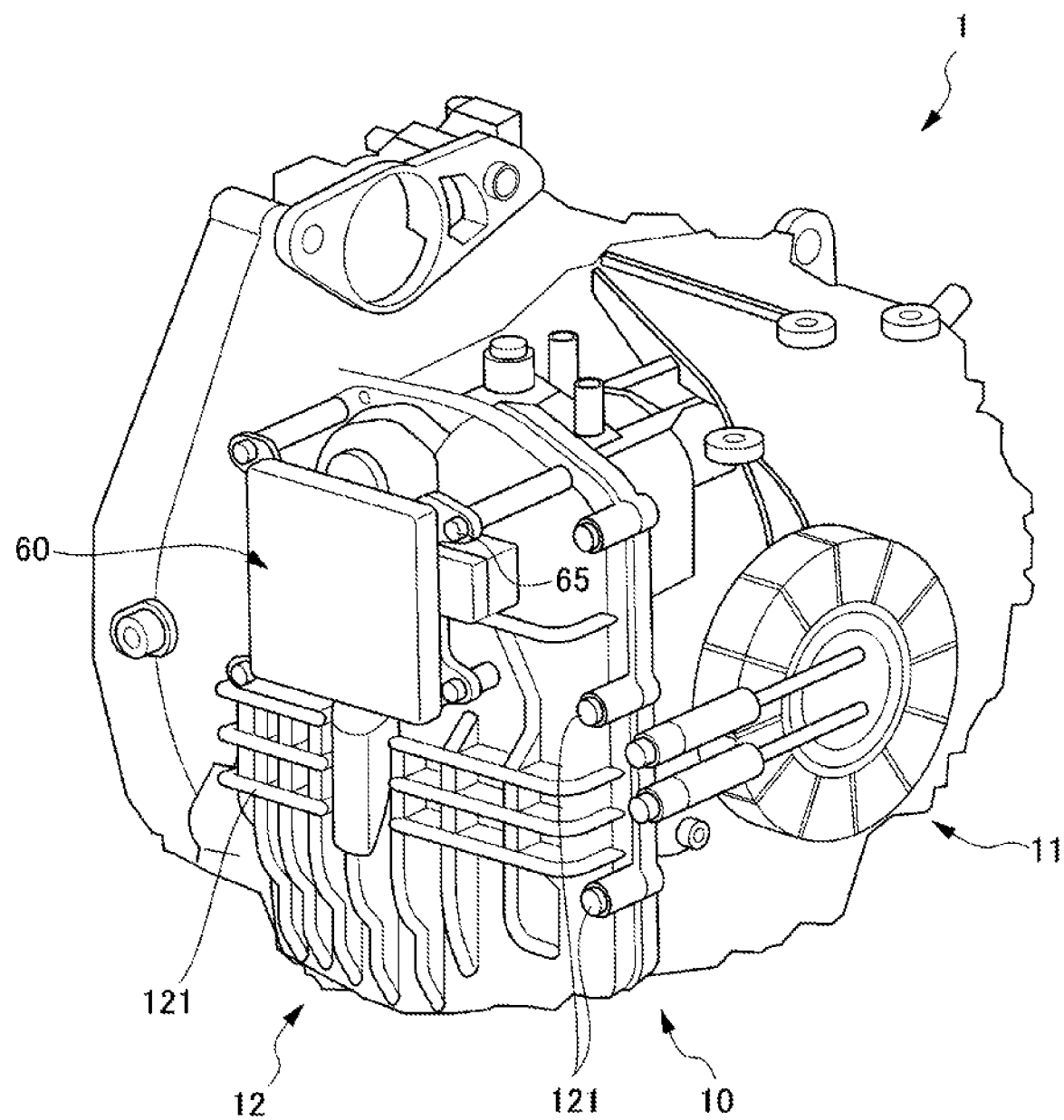
FIG. 2 is a perspective view illustrating an automatic transmission to which a TCU provided with a resin case according to the first embodiment of the present disclosure is attached.

Detailed explanation follows regarding a first embodiment of the present disclosure, with reference to the drawings. Note that in the explanation regarding the second embodiment onward, configurations and the like common to the first exemplary embodiment are allocated the same reference numerals, and explanation thereof is omitted.

Figure 3:
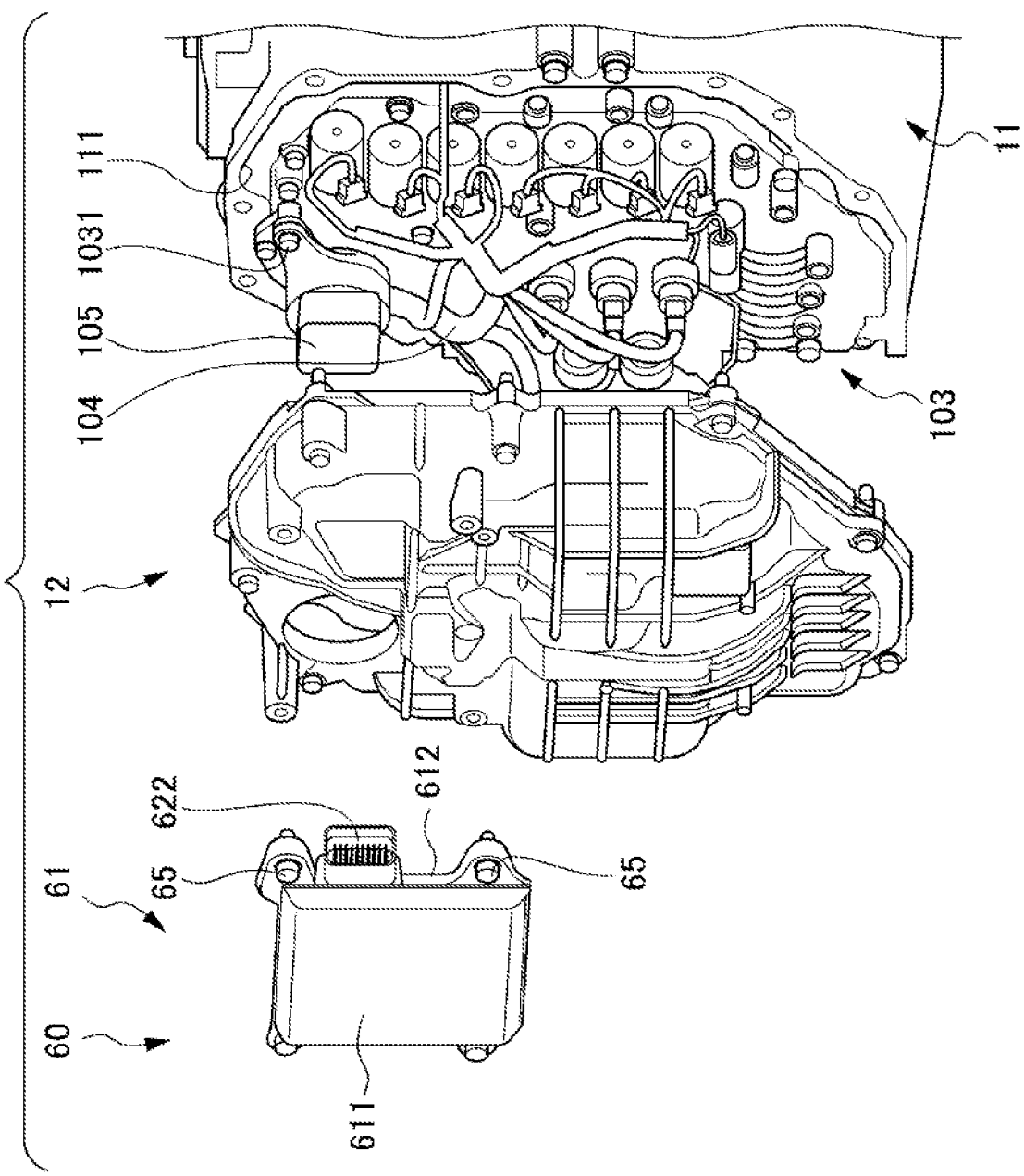
FIG. 3 is an exploded perspective view illustrating an automatic transmission to which a TCU provided with a resin case according to the first embodiment of the present disclosure is attached.

FIG. 1A to FIG. 1C are schematic diagrams illustrating a vehicle to which a TCU 60 provided with a resin case 612 according to the first embodiment of the present disclosure is attached. FIG. 1A is a plan view, FIG. 1B is a side view, and FIG. 1C is a view from underneath. FIG. 2 is a perspective view illustrating an automatic transmission 1 to which the TCU 60 provided with the resin case 612 according to the first embodiment of the present disclosure is attached. FIG. 3 is an exploded perspective view illustrating the automatic transmission 1 to which the TCU 60 provided with the resin case 612 according to the first embodiment of the present disclosure is attached.

As illustrated in FIG. 1A to FIG. 1C, a control unit 60 (referred to below as the TCU (Transmission Control Unit) 60) provided with the resin case 612 is attached to the automatic transmission 1 that transmits torque of an internal combustion engine 110 (ENG) of a vehicle 100 to front wheels RWf, LWf. The automatic transmission 1 is disposed on the left side (corresponding to the right side in FIG. 1A to FIG. 1C) of the internal combustion engine 110 and adjacent to the internal combustion engine 110. The automatic transmission 1 includes a transmission mechanism, not illustrated in the drawings, including rotating components such as plural non-illustrated rotation shafts, disposed parallel to one another, and gears that are rotatably supported around the respective rotation shafts, as well as transmission components such as a clutch, not illustrated in the drawings. The automatic transmission 1 also includes a casing 10 (see FIG. 2) configuring an external wall of the transmission mechanism and housing configuration components of the automatic transmission 1, including the transmission mechanism.

An internal space of the casing 10 principally includes a mechanism chamber, not illustrated in the drawings, in which the transmission mechanism is housed, and an oil pan chamber, not illustrated in the drawings, in which operating oil collects, formed at the bottom of the casing 10 and the vicinity thereof, at the lower side of the mechanism chamber. As illustrated in FIG. 2, the casing 10 includes a casing wall 11 and a casing cover 12. The casing wall 11 is configured by walls that form the internal space of the casing 10. As illustrated in FIG. 3, the front of the casing wall 11 is open toward the front of the vehicle 100, forming an opening 111 that is in communication with the internal space of the casing 10. A peripheral edge of the casing cover 12 is fixed to a peripheral edge of the opening 111 by bolts 121 (see FIG. 2) so as to close off the opening 111.

The transmission mechanism is housed in a non-illustrated transmission case in the mechanism chamber of the casing 10. An oil pressure control body 103 (see FIG. 3) is installed in the transmission case. The oil pressure control body 103 includes, for example, a non-illustrated oil pressure control valve to control the pressure of oil supplied to the transmission mechanism. Oil discharged from a non-illustrated oil pump is supplied to the oil pressure control body 103, and the oil pressure control valve is controlled based on opening and closing signals for the oil pressure control valve. The oil pressure control valve, and sensors such as an oil pressure sensor, and a rotation sensor, are electrically connected to one end of a harness 104. The harness 104 is disposed extending along the oil pressure control body 103, and another end of the harness 104 is gathered into a bundle by a multi-cable coupler 105. As illustrated in FIG. 3, the multi-cable coupler 105 is fixed to the oil pressure control body 103 by a bolt 1031.

A non-illustrated oil strainer (strainer) is installed at the lower side of the oil pressure control body 103 inside the oil pan chamber. The oil strainer draws operating oil that has collected at the bottom of the oil pan chamber into the oil strainer, and filters the operating oil.

The TCU 60 controls the automatic transmission 1 by controlling the oil pressure of the operating oil using a non-illustrated oil pressure controller of the oil pressure control body 103. The TCU 60 includes a case 61, a TCU-side terminal 622, and a non-illustrated electronic substrate. The electronic substrate is housed inside the case 61, and the electronic substrate is electrically connected to the TCU-side terminal 622 (see FIG. 4) that is capable of connecting to a terminal of the multi-cable coupler 105. The terminal of the multi-cable coupler 105 engages with the TCU-side terminal 622, thereby electrically connecting the harness 104 to the electronic substrate of the TCU 60. Moreover, as illustrated in FIG. 2, the TCU 60 is directly attached and fixed to the casing cover 12 by bolts 65.

A non-illustrated breather device is provided at an upper portion of the casing 10. The breather device performs gas-liquid separation to separate what is referred to as an "ATF-air mixture", namely a mixture of air and atomized automatic transmission fluid (ATF), serving as lubricating oil, in the transmission mechanism. Namely, for example, breather blowing due to deterioration of the defoaming performance of the ATF inside the casing 10 is prevented in the breather device, and air passes between the inside and the outside of the casing 10.

Figure 4:
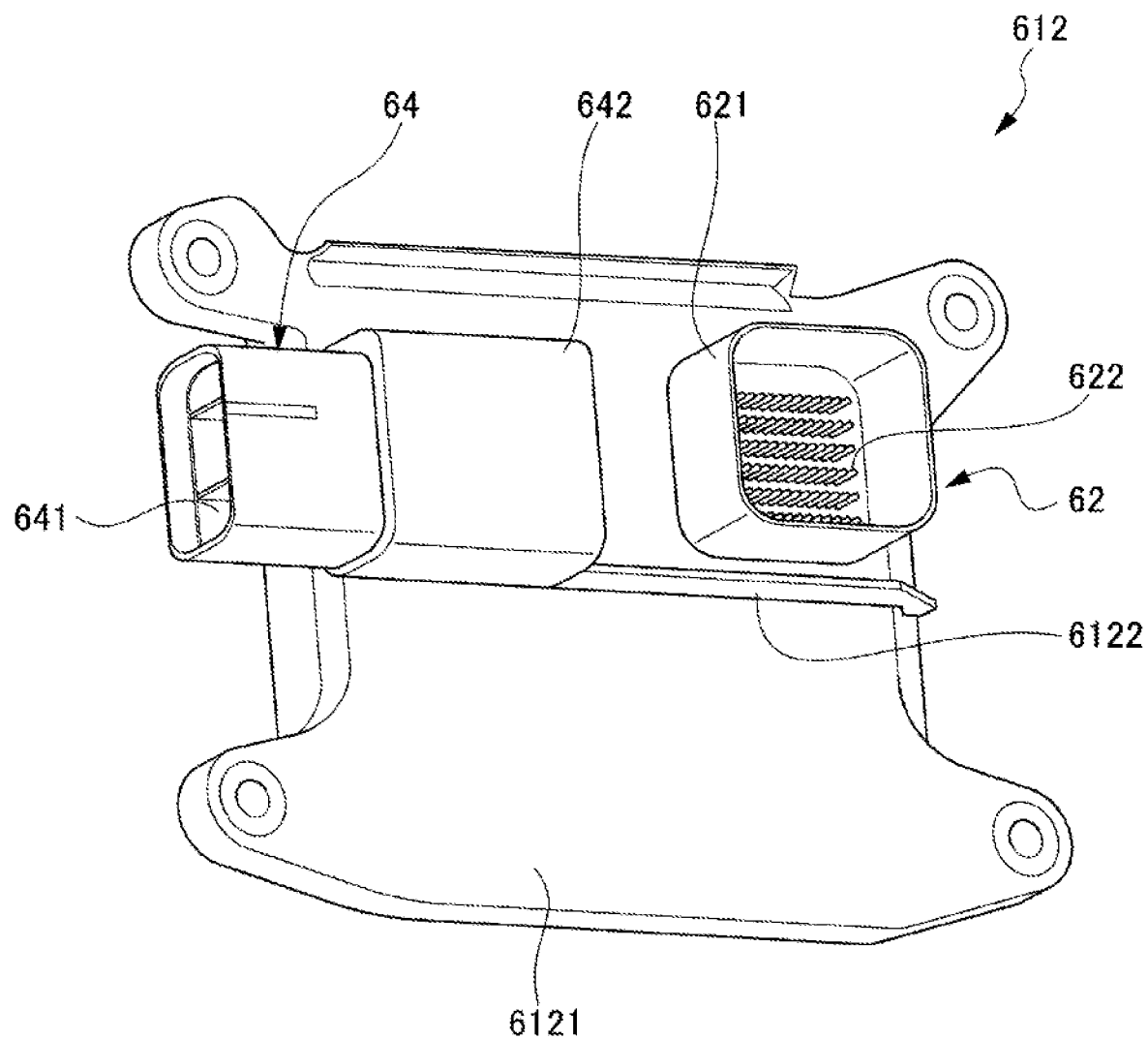
FIG. 4 is a perspective view illustrating a resin case according to the first embodiment of the present disclosure from the rear.
Figure 5:
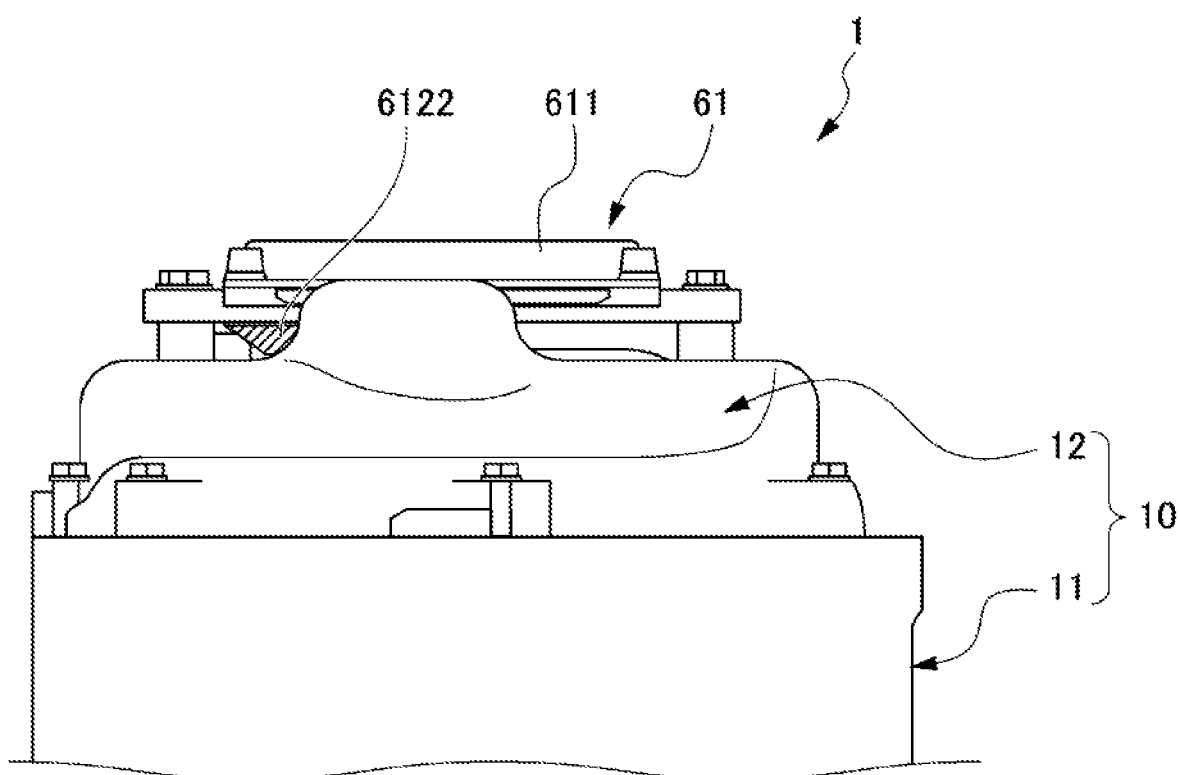
FIG. 5 is an enlarged view from underneath illustrating an automatic transmission to which a TCU provided with a resin case according to the first embodiment of the present disclosure is attached.

Next, detailed explanation follows regarding the resin case 612 configuring the case 61, with reference to FIG. 4 and FIG. 5.

FIG. 4 is a perspective view illustrating the resin case 612 according to the first embodiment of the present disclosure from the rear. FIG. 5 is an enlarged view from underneath illustrating the automatic transmission 1 to which the TCU 60 provided with the resin case 612 according to the first embodiment of the present disclosure is attached. Note that for ease of explanation, in FIG. 5, a rib 6122 is illustrated with hatching.

As illustrated in FIG. 3, the case 61 includes a front side case 611 positioned on a front direction D11 side of the vehicle 100, and the resin case 612 that is positioned toward the rear side of the vehicle 100 so as to face the casing cover 12. The electronic substrate is housed in a substrate housing space formed by the front side case 611 and the resin case 612. The resin case 612 includes a case body 6121 and the rib 6122. As illustrated in FIG. 4, the case body 6121 has a rectangular shape, and an outer face of the case body 6121 that can be seen in FIG. 4 configures a rear face that faces the casing cover 12.

A first connector 62 is provided to a portion in the vicinity of an upper right corner of the rear face of the case body 6121. The first connector 62 includes a peripheral edge portion 621 that has a square column shape projecting toward the rear side of the vehicle 100, and the TCU-side terminal 622 that is electrically connected to the non-illustrated electronic substrate. The TCU-side terminal 622 is electrically connected to the harness 104 by engaging the first connector 62 and the multi-cable coupler 105 with each other.

Moreover, a second connector 64 is provided to a portion in the vicinity of an upper left corner of the rear face of the case body 6121. The second connector 64 includes a sideways-projecting connector terminal 641 and a connector holder 642 that holds and covers a portion on the right side of the sideways-projecting connector terminal 641. The sideways-projecting connector terminal 641 is electrically connected to a central controller of a non-illustrated Electronic Control Unit (referred to hereafter as the ECU) that controls the internal combustion engine 110 and the like for drive control of the vehicle 100.

The rib 6122 is provided at an up-down direction central position on a rear face of the case body 6121. The rib 6122 projects toward the rear of the vehicle 100, and extends from the up-down direction center of a right end portion of the rear face of the case body 6121 toward a left end portion, reaching as far as the connector holder 642 of the second connector 64. Accordingly, at an outer surface of the case body 6121 facing the external wall of the transmission mechanism, the rib 6122 configures a peripheral rib that partially surrounds the first connector 62, specifically, a peripheral rib that surrounds the lower side of the periphery of the first connector 62. The rib 6122 also partitions the rear face of the case body 6121 into upper and lower parts.

Moreover, as illustrated in FIG. 5, as viewed from underneath, the rib 6122 projects by a substantial distance from the rear face of the case body 6121 toward the rear of the vehicle 100 (downward in FIG. 5). Due to this configuration, should high-pressure water spray along the rear face of the case body 6121 from the lower side of the case body 6121, the high-pressure water would hit the rib 6122 and be suppressed from spraying further toward the upper side than the rib 6122. Moreover, the rib 6122 also functions as a heat release rib 6122 that dissipates heat generated by the electronic substrate in the internal space of the case 61, and also raises the rigidity of the resin case 612.

The present embodiment exhibits the following advantageous effects.

The resin case 612 of the present embodiment is placed directly on an external wall of the transmission of the vehicle 100, such that the resin case 612 configures an outer peripheral side of the TCU 60, serving as a control unit of the transmission mechanism, to which the harness 104 connected to the functional components inside the transmission mechanism is electrically connected. The resin case 612 includes the case body 6121 and the rib 6122 provided on the outer surface of the case body 6121.

Accordingly, the rib 6122 on the outer surface of the case body 6121 of the resin case 612 of the TCU 60 secures the rigidity of the resin case 612, and enables rubbing abrasion of the TCU-side terminal 622 of the TCU 60 as a result of vibration of the resin case 612 to be suppressed. Moreover, vibration of the electronic substrate housed inside the TCU 60 is suppressed, enabling damage to the electronic components disposed on the electronic substrate to be suppressed.

The rib 6122 also configures a heat release rib. Namely, the surface area of the resin case 612 of the TCU 60 is increased due to providing the rib 6122, thereby enabling more heat from the TCU 60 to be dissipated. This thereby enables heat generated by the electronic substrate inside the TCU 60 to be efficiently dissipated to the outside of the TCU 60.

The case body 6121 is provided with the first connector 62, to which the harness 104 is electrically connected, and includes the peripheral rib 6122. At the outer surface of the case body 6121 facing at least an external wall of the transmission mechanism, the peripheral rib 6122 at least partially surrounds the periphery of the first connector 62.

Direct water penetration into the first connector 62 can accordingly be suppressed during pressure washing with high-pressure water. This thereby enables the waterproofing of the first connector 62 to be improved.

The peripheral rib 6122 surrounds the lower side of the periphery of the first connector 62. Accordingly, water penetration into the first connector 62 by high-pressure water spraying up from below can be suppressed during pressure washing with high-pressure water. This thereby enables the waterproofing of the first connector 62 with respect to high-pressure water from below to be improved.

Second Embodiment

In a resin case 612A according to a second embodiment of the present disclosure, the configuration of a rib 6122A differs to that in the resin case 612 according to the first embodiment. Other configurations are the same as those of the resin case 612 according to the first embodiment.

Figure 6:
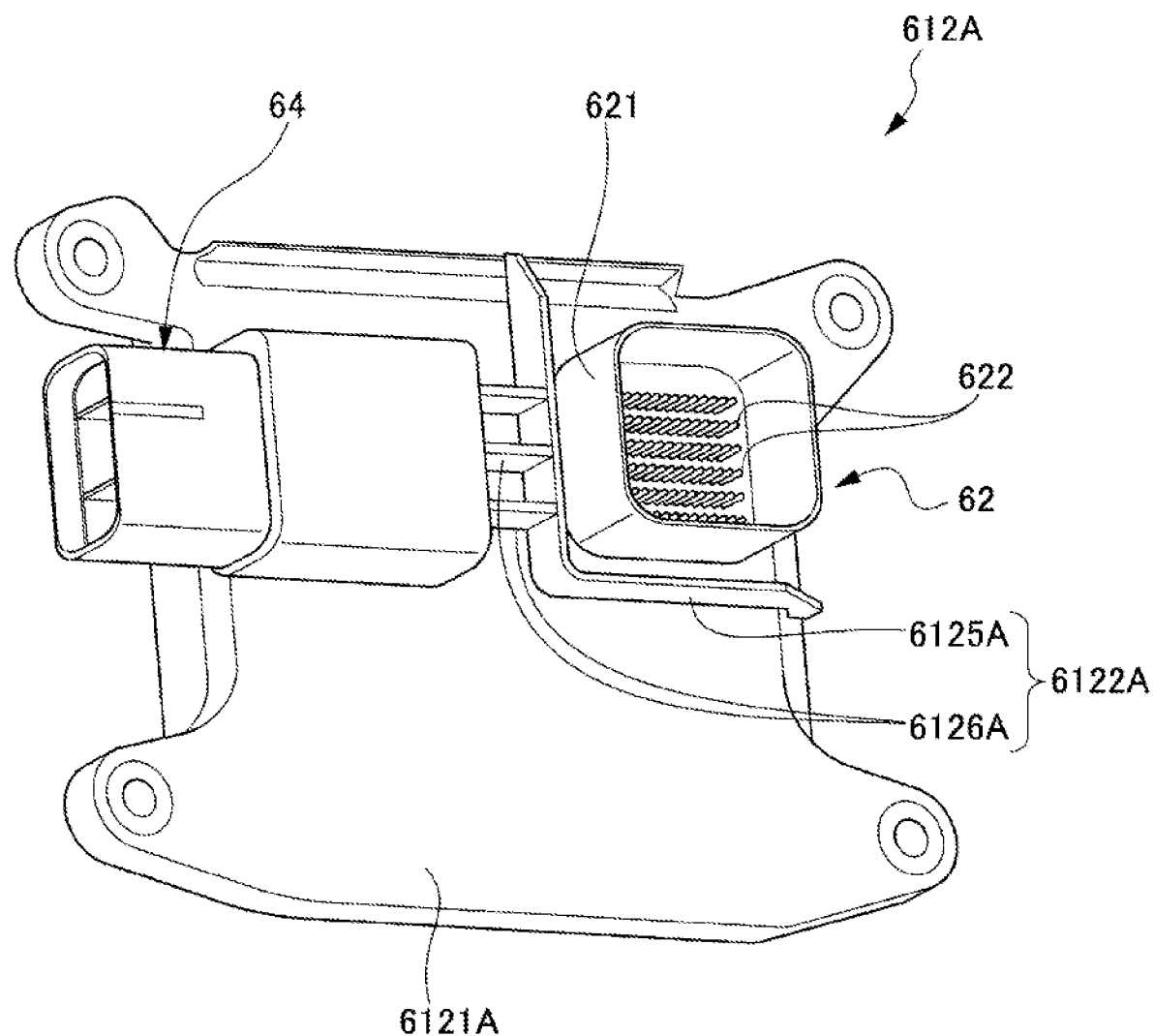
FIG. 6 is a perspective view illustrating a resin case according to a second embodiment of the present disclosure from the rear.
Figure 7:
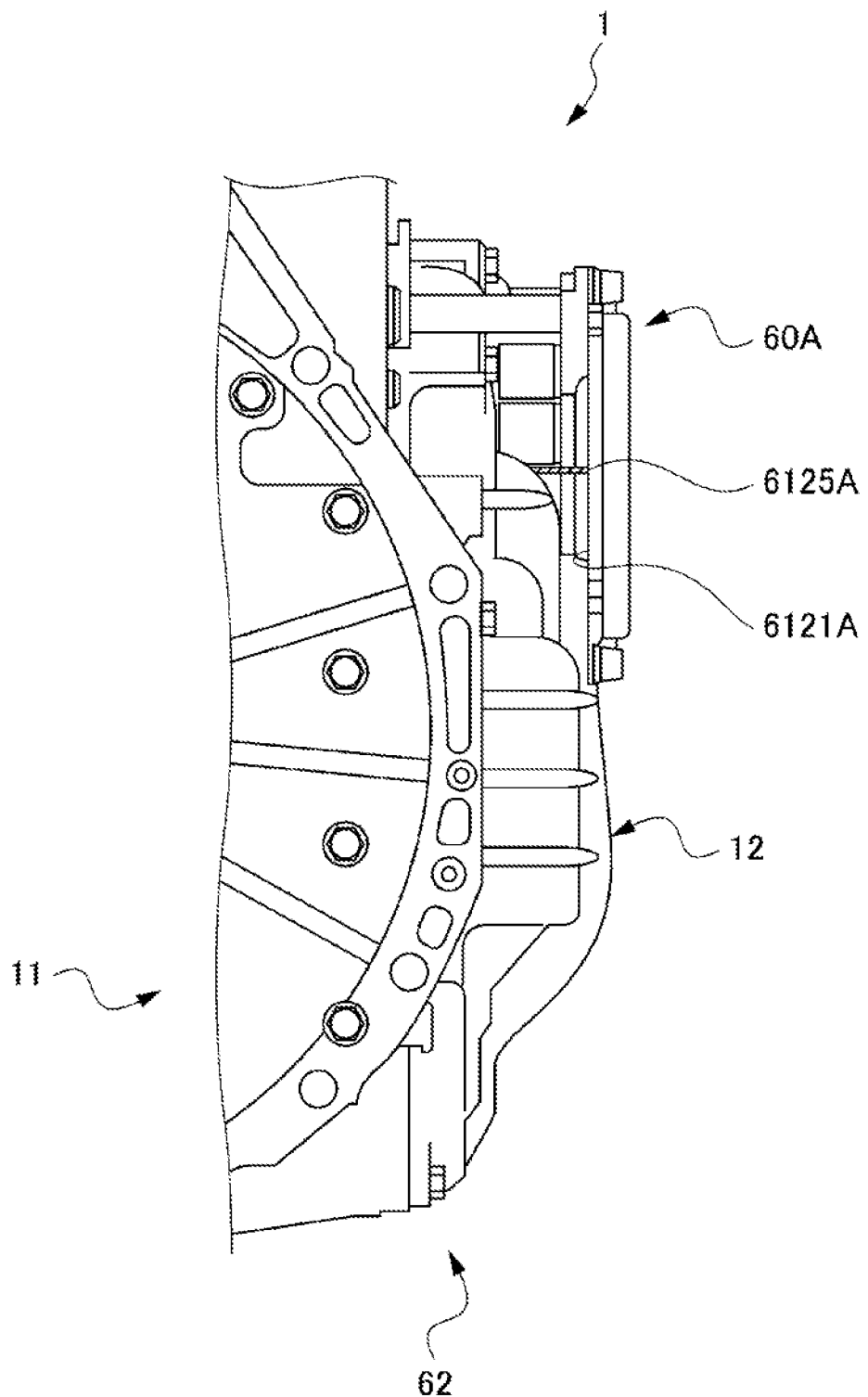
FIG. 7 is an enlarged side view illustrating an automatic transmission to which a TCU provided with a resin case according to the second embodiment of the present disclosure is attached.

FIG. 6 is a perspective view illustrating the resin case 612A according to the second embodiment of the present disclosure from the rear. FIG. 7 is an enlarged side view illustrating the automatic transmission 1 to which a TCU 60A provided with the resin case 612A according to the second embodiment of the present disclosure is attached. Note that for ease of explanation, in FIG. 7, a peripheral rib 6125A is illustrated with hatching.

As illustrated in FIG. 6, the rib 6122A includes the peripheral rib 6125A and connection ribs 6126A. The peripheral rib 6125A projects from an outer face of a case body 6121A toward the rear, and extends in an L-shape following two side faces of the square column-shaped peripheral edge portion 621. Specifically, the peripheral rib 6125A extends in the left-right direction following a side face positioned at the lower side of the square column-shaped peripheral edge portion 621, and extends in the up-down direction following a side face positioned on the left side of the square column-shaped peripheral edge portion 621. Namely, the peripheral rib 6125A surrounds the lower side and the left side of the periphery of the first connector 62, at the outer surface of the case body 6121A facing the external wall of the transmission mechanism, and partitions the outer face of the case body 6121A into a region including the first connector 62, and a remaining region, namely a region including the second connector 64.

Due to this configuration, similarly to the rib 6122 of the first embodiment, in the portion of the peripheral rib 6125A extending in the left-right direction and also the connection ribs 6126A, should high-pressure water spray along the rear face of the case body 6121A from the lower side of the case body 6121A, the high-pressure water would hit the peripheral rib 6125A and the connection ribs 6126A, suppressing the high-pressure water from rising any further to the upper side. Moreover, as illustrated in side view in FIG. 7, the portion of the peripheral rib 6125A extending in the up-down direction projects by a substantial distance from the rear face of the case body 6121A toward the rear of the vehicle 100 (toward the left in FIG. 7). Accordingly, when high-pressure water sprays along the rear face of the case body 6121A from the left side of the case body 6121A, the high-pressure water hits the rib 6122A, suppressing the high-pressure water from reaching any further toward the right side.

The connection ribs 6126A are configured by three ribs extending parallel to each other. The connection ribs 6126A project from the external face of the case body 6121A toward the rear, and each extend toward the right as far as the peripheral rib 6125A, from respective positions at an up-down direction central portion of a left edge of the second connector 64, and portions separated by a predetermined distance above and below the up-down direction central portion. The connection ribs 6126A thereby connect the peripheral rib 6125A and the second connector 64 together.

The present embodiment exhibits the following advantageous effects.

In the resin case 612A of the present embodiment, the case body 6121A is provided with the second connector 64 that is electrically connected to the central controller that performs drive control of the vehicle 100. The peripheral rib 6125A is disposed so as to partition the outer surface of the case body 6121A facing an external wall of the transmission mechanism into the region including the first connector 62, and the region including the second connector 64.

Accordingly, water penetration into the first connector 62 with high-pressure water from the direction of the region including the second connector 64 can be suppressed during pressure washing with high-pressure water. This thereby enables the waterproofing of the first connector 62 with respect to high-pressure water from the direction of the region including the second connector 64 to be improved.

Moreover, the rib 6122A includes the connection ribs 6126A connecting the peripheral rib 6125A and the second connector 64 together. Force on the first connector 62 and the second connector 64 acts from different directions. However, due to providing the connection ribs 6126A, the rigidity with respect to force from these different directions is raised, enabling elastic deformation of the resin case 612A to be suppressed. As a result, the effect of elastic deformation of the resin case 612A on the TCU-side terminal 622 of the TCU 60A can be reduced, enabling wear of the TCU-side terminal 622 of the TCU 60A to be suppressed.

Note that the present disclosure is not limited to the embodiments described above, and the present disclosure encompasses modifications, improvements, and the like within a range capable of achieving the advantageous effects of the present disclosure.

For example, configuration of a resin case is not limited to the configuration of the resin case 612 in the embodiments. Thus, for example, a rib is not limited to the configuration of the rib 6122, rib 6122A of the embodiments.

What is claimed is:

1. A resin case to be installed in a vehicle, comprising:
a case body having a mount surface mounted directly on an external wall of a vehicle transmission casing and having an outer surface which constitutes part of a case of a control unit for a vehicle transmission such that the outer surface of the case body is placed outside of the external wall of the vehicle transmission casing, the case body having a first connector to which a harness is electrically connected, the harness being electrically connected to a functional component inside the transmission casing; and
a rib formed on the outer surface of the case body outside of the external wall of the vehicle transmission casing, the rib comprising a peripheral rib that protrudes from the outer surface of the case body toward the external wall of the vehicle transmission casing and surrounds at least part of a periphery of the first connector at the outer surface of the case body facing at least the external wall of the transmission casing, the peripheral rib extending to a position closer to the external wall than the mount surface of the case body.

2. The resin case according to claim 1, wherein the rib comprises a heat release rib configured to release heat from the control unit.

3. The resin case according to claim 1, wherein the peripheral rib surrounds a lower side of the periphery of the first connector.

4. The resin case according to claim 1, wherein
the case body has a second connector electrically connected to a central controller which controls driving of the vehicle, and
the peripheral rib is disposed so as to partition the outer surface facing the external wall of the transmission casing into a first region where the first connector is located and a second region where the second connector is located.

5. The resin case according to claim 4, wherein the rib further comprises a connection rib that connects the peripheral rib and a periphery of the second connector together such that the connection rib bridges the peripheral rib and the periphery of the second connector.

* * * * *